US010826561B2

(12) United States Patent
Gallagher et al.

(10) Patent No.: US 10,826,561 B2
(45) Date of Patent: Nov. 3, 2020

(54) SYSTEM FOR ASSESSING TELECOMMUNICATIONS WIRING

(71) Applicant: TELETECH PTY LTD, Blackburn, Victoria (AU)

(72) Inventors: Sean Anthony Gallagher, Mt. Waverley (AU); Malcolm Charles Basell, The Patch (AU); Gregg Alan Wallace, Melbourne (AU)

(73) Assignee: TELETECH PTY LTD, Blackburn (AU)

( * ) Notice: Subject to any disclaimer, the term of this patent is extended or adjusted under 35 U.S.C. 154(b) by 0 days.

(21) Appl. No.: 16/303,057

(22) PCT Filed: May 22, 2017

(86) PCT No.: PCT/AU2017/050479
§ 371 (c)(1),
(2) Date: Nov. 19, 2018

(87) PCT Pub. No.: WO2017/197469
PCT Pub. Date: Nov. 23, 2017

(65) Prior Publication Data
US 2019/0305818 A1   Oct. 3, 2019

(30) Foreign Application Priority Data
May 20, 2016   (AU) .................... 2016901919

(51) Int. Cl.
*H04B 3/46* (2015.01)
*H03M 13/09* (2006.01)
(Continued)

(52) U.S. Cl.
CPC ............. *H04B 3/46* (2013.01); *G01R 31/44* (2013.01); *G01R 31/50* (2020.01); *H03M 13/09* (2013.01);
(Continued)

(58) Field of Classification Search
CPC .......... H04B 3/46; G01R 31/50; G01R 31/44; G01R 31/60; H03M 13/09; H04L 1/0061; H04M 11/062
See application file for complete search history.

(56) References Cited

U.S. PATENT DOCUMENTS 3,891,811 A     6/1975  Miller
2001/0055377 A1* 12/2001 Rahamim ............. H04M 1/573
                                                  379/142.12
(Continued)

FOREIGN PATENT DOCUMENTS

CA      2011208 A1    8/1991
GB      2503636 A     1/2014
(Continued)

OTHER PUBLICATIONS

International Search Report and Written Opinion dated Jul. 28, 2017 for PCT Application No. PCT/AU2017/050479, 12 pages.
(Continued)

*Primary Examiner* — Vineeta S Panwalkar
(74) *Attorney, Agent, or Firm* — Kilpatrick Townsend & Stockton LLP

(57) ABSTRACT

Devices, methods and systems for assessing telecommunications wiring between a first plurality of terminals and a second plurality of terminals are disclosed. A system includes a first device and a second device. The first device can be in electrical communication with the first plurality terminals to listen for terminal identification data that is receivable on each of the first plurality of terminals, wherein the device is configured to decode, for each terminal of the plurality of terminals, identification data that is specific to a single terminal of the second plurality of terminals. The second device is a sender device configured to generate different signals for respective terminals of the second
(Continued)

plurality terminals, each signal encoding different terminal identification data.

16 Claims, 6 Drawing Sheets

(51) Int. Cl.
*H04L 1/00* (2006.01)
*H04M 11/06* (2006.01)
*G01R 31/44* (2020.01)
*G01R 31/50* (2020.01)

(52) U.S. Cl.
CPC ......... *H04L 1/0061* (2013.01); *H04M 11/062* (2013.01)

(56) References Cited

U.S. PATENT DOCUMENTS

| | | | |
|---|---|---|---|
| 2002/0149894 A1* | 10/2002 | Gregorius | H03K 17/0822 361/86 |
| 2010/0054425 A1* | 3/2010 | Elder | H04M 3/229 379/32.04 |
| 2011/0043333 A1 | 2/2011 | German | |
| 2011/0125601 A1* | 5/2011 | Carpenter | G06Q 30/06 705/26.1 |
| 2011/0304313 A1 | 12/2011 | Diab | |
| 2012/0188865 A1 | 7/2012 | Michaelis et al. | |
| 2012/0281509 A1 | 11/2012 | Liang et al. | |
| 2014/0264331 A1* | 9/2014 | Yao | H01L 22/32 257/48 |
| 2014/0313935 A1 | 10/2014 | Koziy et al. | |

FOREIGN PATENT DOCUMENTS

| | | |
|---|---|---|
| WO | 2012136965 A1 | 10/2012 |
| WO | 2015/066327 A1 | 5/2015 |

OTHER PUBLICATIONS

Extended European Search Report dated Nov. 6, 2019 for EP Application No. 17798414.3, 9 pages.

* cited by examiner

SYSTEM FOR ASSESSING TELECOMMUNICATIONS WIRING

CROSS-REFERENCES TO RELATED APPLICATIONS

This application is the U.S. National Phase of PCT Application No. PCT/AU2017/050479, filed May 22, 2017, and which claims priority to Australian Application No. 2016901919, filed May 20, 2016 which are all herein incorporated by reference in their entirety for all purposes.

FIELD OF THE INVENTION

The present invention relates to assessing telecommunications wiring between a first plurality of terminals and a second plurality of terminals in a telecommunications product, or in a part of a telecommunications network.

BACKGROUND OF THE INVENTION

Part of an exemplary telecommunications network 10 is illustrated in FIG. 1. The telecommunications network has a serviceable cross-connection facility/interface 12. The cross-connection interface 12 may be a service area interface (eg a "copper pillar", in Australia) which is generally located outdoors, between a network exchange and network users (ie customers). Alternatively, the cross-connection interface 12 may be a distribution frame, located closer to, or at, customers or the exchange. At the customer end, the distribution frame may be outside the customer premises or, in the case of large apartment buildings, may be inside the premises.

The cross-connection interface connects a first set of telecommunication lines 14 on one side of the cross-connection interface 12 and to a second set of telecommunication lines 16 on the opposite side of the cross-connection interface 12. Either the first or the second set of telecommunication lines services various customers, and the other set connects back to a telecommunication exchange.

In the embodiment shown in FIG. 1, the first set of telecommunication lines 14 connects to the various customers. At the customer end, each of the telecommunication lines 14 may be connected to one or more corresponding devices, such as a telephone, a modem, a fax machine, or an alarm system etc. In a residential environment, commonly each home will be serviced with one, or sometimes more than one, of these telecommunication lines 14.

Each of the first telecommunication lines 14 consists of two conductors which, in current telecommunications networks, is a twisted pair of wires. The twisted pairs of wires that are routed from the customer access point (where the end device is connected) to the cross-connection interface 12. The customer side 15 of the cross-connection interface 12, also known as the distribution side, has a set of N pairs of terminals 21 for connecting to respective telecommunication lines of the first set of telecommunication lines 14. Such a set of terminals is herein referred to as a "terminal block". However, it will be appreciated that such a terminal block may be comprised of physically separate terminal blocks that are grouped together.

An opposite, exchange side 17 of the cross-connection interface 12 has D pairs of terminals 23 for connecting to respective telecommunication lines of the second set of telecommunication lines 16, which are directed back towards the telecommunications exchange. Like the first set of telecommunication lines 14, each of the second set of telecommunication lines consists of a twisted pair of wires. The second set of telecommunication lines 16 may be connected directly back to the exchange or may be routed via further, larger cross-connection interfaces.

In some cases, there are fewer telecommunication lines on the exchange side 17 of the cross-connection interface 12 than on the customer side 15. For example, for a distribution frame, the quantity of lines on the exchange side may be half the quantity of lines on the customer side. Commonly there are 600 or 1200 pairs of terminals on the customer side 15, and 300 to 600 pairs of terminals on the exchange side 17.

For a copper pillar service area interface there may, in the case of a small pillar, be 200 pairs on the exchange side and 300 pairs on the customer side. A large pillar, on the other hand may have, 600 pairs on the exchange side and 1200 pairs on the customer side.

The twisted-wire pairs of the telecommunication lines connect to respective terminal pairs on its corresponding side of the cross-connection interface 12. The terminal pairs of the customer side terminal block 21 of the cross-connection interface 12 are collectively arranged in a longitudinally extending row, with each longitudinal location in the row having one pair of terminals. Similarly, the terminal pairs 23 of the terminal block on exchange-side of the cross-connection interface 12 are collectively arranged in a longitudinally extending row, with each longitudinal location in the row having one pair of terminals.

For simplicity, each terminal pair is indicated in FIG. 1 as a single termination point (1 to D on the exchange side, and 1 to N on the customer side). Telecommunication lines on opposite sides of the cross-connection interface are connected to each other by jumpers or some other mechanism that connects termination points on one side to termination points on the other. However, which termination point connects to which termination point is not fixed. When a connection is made between a customer line and an exchange line, the connection is decided depending on which of the exchange side telecommunication lines are not already in use. In the example shown in FIG. 1, terminal pairs 1, 3 and 4 of the customer side, are respectively connected to terminal pairs 2, 3 and 1 of the exchange side by respective jumpers 28, 29 and 30. Other terminals, such as terminal 2 on the customer side and terminal 4 on the exchange side, may be unconnected to any other terminal, whereby the terminals are not used, but are free for future use.

It can be difficult to know which of the first set of telecommunication lines is connected to which of the second set of telecommunication lines. When a serviceman visits the cross-connection interface to service a fault or connect a new customer to a given line to the exchange, the serviceman may not be able to readily ascertain which customer-side lines are connected to which exchange-side lines without undertaking the very arduous process of tracing each of the jumpers by hand from the exchange side to the customer side of the cross-connection interface unless the service has a system for mapping the connections. Therefore, telecommunications service providers maintain an electronic map, stored in a telecommunications database, that identifies the connections between the first and second sets of telecommunication lines, and it is important the map be maintained, as accurately as possible.

To meet the bandwidth requirements of modern telecommunications, many networks are being updated to have Fibre-to-the-Node or Fibre-to-the-Distribution Point technology. In such cases, customer connections route to an optic fibre-to-copper wire interface 20 (eg a Fibre-to-the-Node cabinet). At the fibre-to-copper wire interface, a set/block of terminal pairs 22 is provided for connecting to twisted-wire pairs from customers. The twisted wire pairs may be used for a Digital Subscriber Line (DSL) or Very high bit-rate Digital Subscriber Line (VDSL), and a Plain Old Telephone Service (POTS). The digital component, DSL or VDSL, is interfaced with optic fibre, at converter 26, to enable it to be optically communicated to/from the communications network. Optionally, depending on the needs of the network, the analog component for the POTS is separated out by splitters (not shown) and terminated at another set/block of terminal pairs 24.

Each POTS wire is terminated at a different terminal location in the block of terminals 24. The location in the block of terminals 24 may match the location in the block of terminals 22 of the combined POTS/VDSL service. Alternatively, connections between a pair of terminals in the block of terminals 22 and its corresponding pair of terminals in the block of terminals 24, for the same telecommunication line, may be inverted (ie the lines match but the A and B terminals for the line may be swapped).

In telecommunications networks where Fibre-to-the-Node (or to some other location) is being rolled out, there is a need for the terminations of the optic fibre-to-copper wire interface 20 to be connected, en masse, with the terminations of cross-connection interface 12. For example a newly installed Fibre-to-the-Node cabinet may need to be connected to an existing copper pillar.

In the exemplary implementation of FIG. 2, the connection involves using a tie cable 27 to connect terminal block 21 of customer side 15 of the cross-connection interface 12 to the converter 26 in the optic fibre-to-copper wire interface 20. In doing so, the existing connections between the terminal block 21 of customer side 15 and the terminal block 23 of the exchange side 17 of the cross-connection interface 12 are replaced by a new connection between the terminal block 21 of customer side 15 and the terminal block 22 of the optic fibre-to-copper wire interface 20.

At a first end 31 of the tie cable 27, L terminal pairs for servicing customers are provided on a terminal block 25, where L may be equal to N, D or some other number less than N. L may be less than N because it may be that not all of the N terminal pairs of terminal block 21 are needed. The terminal block 25 has the L terminal pairs arranged in a longitudinally extending row, with each longitudinal location in the row having one pair of terminals.

At the other, second end of the tie cable 27, L pairs of terminals are likewise provided as a terminal block 34, and likewise, the terminal block 34 has the L terminal pairs arranged in a longitudinally extending row, with each longitudinal location in the row having one pair of terminals.

The terminals at terminal block 34 are wired via twisted pairs (an "A" wire and a "B" wire) within tie cable 27 to the terminals at terminal block 25. The wiring has a one-to-one mapping of terminals between terminal blocks, which herein is intended to mean that the first A terminal, the first B terminal, the second A terminal, the second B terminal, . . . and so on, to the Jth A terminal and the Jth B terminal of one of the terminal blocks (eg terminal block 34) are respectively connected to the first A terminal, the first B terminal, the second A terminal, the second B terminal, . . . and so on, to the Jth A terminal and the Jth B terminal of the plurality of terminals at the other terminal block (eg terminal block 25), where J is the number of terminal pairs that are connected between the two terminal blocks at the ends of the tie cable. In one embodiment J is equal to L so that all of the tie cable terminal pairs are populated with wire pairs, but in other embodiments J may be less than L.

The tie cable 27 includes (or connects to) the terminal block 34 at one end of the cable and the terminal block 25 at the other end, and provides a one-to-one connection of terminals between terminal blocks 34 and 25. Ordered connections are made with jumper wires between the terminals of terminal block 22 and the terminals of terminal block 34. Because of the one-to-one relationship of the tie cable 27, the ordering of the telecommunication lines to/from the fibre network on the terminal block 22 is replicated in the same order on terminal block 25.

However, if the one-to-one wiring is not performed accurately, one or more customers may be connected to the wrong telecommunications line. Alternatively, their service may be completely disconnected. The latter case may occur, for example, if the customer's associated twisted wire pair is split to terminate at two different terminal pairs in a terminal block 31, 34, or 22.

FIGS. 3A to 3D are wiring diagrams illustrating interconnections between a first plurality of terminals at one of the copper-wire cross-connection interface 12 and the optic fibre to copper wire converter 20, and a second plurality of terminals at the other of the copper-wire cross-connection interface 12 and the optic fibre to copper wire converter 20. These figures illustrate some examples of how twisted pairs, though intended to be wired with one-to-one wiring, may be incorrectly wired in practice.

In FIG. 3A, pair 1 is correctly wired so that wires connect the first terminals 1A and 1B with the second terminals 1A' and 1B', respectively. However, pair 2 is inverted, because wires connect terminals 2A and 2B to terminals 2B' and 2A', respectively. In use, data is transmitted as a differential signal, with a differential signal being transmitted on each twisted wire pair. Thus, data transmitted over the first pair will be correctly received, but the data transmitted over the second pair will be inverted.

In FIG. 3B, the B wire from terminal 1 is swapped with the A wire from terminal 2, so that terminals 1B' and 2A' receive wires from terminals 2A and 1B, respectively. Neither the first nor the second wire pair is functional because any differential signals transmitted onto each of terminal pairs 1 and 2 on one end is not receivable as a differential signal on terminal pair 1 and a differential signal on terminal pair 2, at the other end.

In FIG. 3C, the B wires from terminals 1 and 2 are swapped with each other. Neither the first nor the second wire pair is functional because any differential signals transmitted onto each of terminal pairs 1 and 2 on one end is not receivable as a differential signal on terminal pair 1 and a differential signal on terminal pair 2, at the other end.

In FIG. 3D, one wire from the first terminal pair is correctly connected between the A terminals of the first terminal pair, but the B wire, from terminal 1B, is incorrectly connected to terminal 2A'. The first wire pair is not functional because terminal 1B' is unconnected, so any differential signals transmitted on terminals 1A and 1B will not be received as a differential signal between terminals 1A' and 1B'. FIG. 3D also shows that the second terminal pair is mapped from terminal pair 2 to terminal pair 3. A differential signal on transmitted terminals 2A and 2B can be received between pairs 3A and 3B, but since it is received on the wrong terminal pair, the customer will be connected to the wrong telecommunications line.

Returning to FIG. 2, POTS terminals are provided on terminal block 24, having locations that correspond in a one-to-one manner with terminal block 22. A one-to-one tie-cable 36, synonymous with tie-cable 27, has one set of terminals 38 at one end, connected with a one-to-one correspondence to another set of terminals 40 at a second end. Connections are made between the terminals of terminal block 40 and the terminals of terminal block 23, thus the customers accessing terminal block 21 are connected to the POTS terminal service provided on terminal block 23. Because of the one-to-one relationship of the tie cable 36, the ordering of the telecommunication lines on the terminal block 24 is replicated in the same order on terminal block 40. In practice, the relationship may be sequential (so the terminal positions match), but not one-to-one. This is because some of the terminal pairs may be unused and therefore left disconnected to simplify the connection of the converter 26 to terminal blocks 22 and 24. The only non sequential terminal connections that occur are in the copper pillar 12, with the exception that some telecommunication lines may potentially be inverted between terminal blocks 22 and 24. However, even with such inverted lines a sequential connection of the telecommunication lines is maintained, when considered as wire pairs rather than as individual wires.

The non sequential connections are between terminal blocks 21 and 25 and between terminal blocks 40 and 23, and they are configured to maintain the same non sequential mapping of telecommunication lines that existed between terminal blocks 21 and 23 before the installation of the tie-cables 27 and 36. Therefore the stored electronic map of the telecommunication lines into and out of the cross-connection interface 12 is unaffected by the incorporation of the tie-cables. For example, transferring the same relationship shown in FIG. 1 to the portion of the network shown in FIG. 2, terminal pairs 1, 3 and 4 of terminal block 21 are still connected to terminal pairs 2, 3 and 1, respectively, of terminal block 23.

As will be appreciated, for the cross-connection interface mapping to be correctly preserved, one-to-one line connections must be maintained to and from the optic fibre-to-copper wire interface 20. In practice, the one-to-one connections are maintained at the terminal level, not just telecommunication line (ie wire pair) level.

When installing each tie-cable 27, 36, the tie cable is connected to at least one terminal block (blocks 25 and/or 34 for cable 27; blocks 40 and/or 38 for cable 36) on site, at the time of installation, rather than beforehand in a factory. This is because the tie-cable generally must be routed underground between the cross-connection interface 12 and the optic fibre-to-copper interface 20, and the terminal blocks are too bulky to route underground with the cable. Since at least one of the terminal blocks is connected on site, it can be difficult to implement the required one-to-one connection between the terminal blocks at opposing ends of the tie-cable. This is especially so because the cross-connection interface 12 and the optic fibre-to-copper interface 20 can be substantially remote from each other, potentially separated by 100 metres, or more.

In addition to potential wiring errors between opposite ends of the tie-cable, there may also be errors in the intended sequential connection between the terminal blocks at the ends of the tie-cable and the corresponding terminal blocks of the optic fibre-to-copper interface 20 to which they are connected (ie blocks 22 and 24).

The potential for these wiring errors introduces uncertainty over whether the previously established electronic map of the network is correct after the cross-connection interface 12 and the optic fibre-to-copper interface 20 are installed.

Further, verifying and/or mapping wiring between a first plurality of terminals that is spaced from a second plurality of terminals is also important in other telecommunications applications. This includes applications in which the wiring is set up to be permanent infrastructure wiring, such as wiring between a main distribution frame of a multi-level building and sub-distribution frames on each level of the building, or such as from the sub-distribution frame to access outlets on walls of the building. Further, it is important to verify wiring in cables other than single pairs of twisted wire cables for telephones, particularly as an increasing number of telecommunication devices, including phones, rely on IP-based communication transmitted over a digital network. For example, the first plurality of terminals and second plurality of terminals may be terminals of respective RJ45 connectors on opposing ends of an Ethernet cable, which includes 4 pairs of twisted wires. Such infrastructure wiring will generally need to be terminated with the RJ45 connectors during the process of installation, and there is a risk that this is done incorrectly.

Reference to any prior art in the specification is not an acknowledgment or suggestion that this prior art forms part of the common general knowledge in any jurisdiction or that this prior art could reasonably be expected to be understood, regarded as relevant, and/or combined with other pieces of prior art by a skilled person in the art.

SUMMARY OF THE INVENTION

A first aspect of the present invention provides a device for assessing telecommunications wiring between a first plurality of terminals and a second plurality of terminals, the device being operable to be in electrical communication with the first plurality terminals to listen for terminal identification data that is receivable on each of the first plurality of terminals, wherein the device is configured to decode, for each terminal of the plurality of terminals, identification data that is specific to a single terminal of the second plurality of terminals.

Thus, a pair of terminals, in which each terminal in the pair is wired to a different wire in a twisted pair of wires, may be separately identified, independent from each other. With this approach, even a single wire can be identified. Optionally, the device is configured to include a plurality of single-ended inputs for receiving signals from respective terminals of the first plurality of terminals. Thus, even if a differential signal is transmitted on a twisted pair of wires (so as to reduce interference between different wire pairs), data received on each terminal connected to the twisted pair can be independently identified.

Preferably, the first plurality of terminals are arranged in pairs and the second plurality of terminals are arranged in pairs, each pair being for a different twisted pair of wires, wherein complementary signals received on two terminals of the first plurality of terminals are decoded to identify two different terminals of the same terminal pair of the second plurality of terminals.

A second aspect of the present invention provides a device for assessing telecommunications wiring between a first plurality of terminals and a second plurality of terminals, the device being operable to be in electrical communication with the first plurality terminals to listen for terminal identification data that is receivable on each of the first plurality of terminals, wherein the device includes a plurality of single-ended inputs for receiving signals from respective terminals of the first plurality of terminals.

A third aspect of the present invention provides a device for assessing telecommunications wiring between a first plurality of terminals and a second plurality of terminals, the device being operable to be in electrical communication with the first plurality terminals to listen for terminal identification data that is receivable on each of the first plurality of terminals, wherein for each terminal of the first plurality of terminals, the device listens for terminal identification data regardless of whether terminal identification data has been received on any other terminal of the first plurality of terminals.

Since the device listens for terminal identification data regardless of whether terminal identification data has been received on any other terminal of the first plurality of terminals, the assessment of each of the terminals can essentially be performed in parallel, as the device need not wait for one terminal to be assessed before moving on to assess another terminal. This can result in telecommunications wiring being assessed faster than if each terminal is assessed in a sequential manner.

Preferably, for each of the first, second and third aspects of the present invention, the device determines for each terminal whether, after listening for data for a set duration of time (eg 5 or 10 seconds), data has been correctly received. Preferably, in an event that data is not correctly received, the device generates an indication that the receipt of data failed.

A failure to correctly receive the data may be due to, for example, no wire being connected to the terminal, or a wire being connected to the terminal but shorted to ground. The device may be grounded to assist in the ability to detect that a wire connected to the terminal is short circuited to ground.

In some embodiments receipt of a single packet that defines terminal identification data is sufficient to consider that data has been correctly received. The device may verify a Cyclic Redundancy Check in the data to determine whether the data has been correctly received. In some embodiments, for data to be considered correctly received, identical terminal identification data must be received a predetermined number of times (eg, at least twice) within the set duration of time.

A fourth aspect of the present invention provides a device for assessing telecommunications wiring between a first plurality of terminals and a second plurality of terminals, the device being operable to be in electrical communication with the second plurality of terminals to transmit terminal identification data onto each of the second plurality of terminals, wherein the device is configured to generate different signals for respective terminals of the second plurality terminals, each signal encoding different terminal identification data.

Preferably, the second plurality of terminals are arranged in pairs, each pair being for a different twisted pair of wires, wherein the signals for each terminal in a terminal pair are complementary to each other.

In one embodiment, a time taken for the device to transmit terminal identification data onto all of the second plurality of terminals is determined by the device. In other words, the time taken is not dependent on the network wiring or on any other device(s) that may receive said transmitted data. Optionally, the time taken may be fixed.

For example, the device may transmit identification data on each of the second plurality of terminals without waiting for an acknowledgement or other reply signal from the first plurality of terminals to indicate whether any transmitted identification data has been received at the first plurality of terminals. Thus, the device can operate in a free-running mode. The device may repeatedly transmit identification data, a fixed or indefinite number of times, on all of the terminals until the device is deactivated. Since the device does not wait for any acknowledgement or other reply signal the duration of time taken to transmit identification data on all of the second plurality of terminals can be fixed.

The device of any of the first, second, third and fourth aspects of the present invention may include a connector for electrically connecting to a plurality of terminals, and advantageously, may be expandable to include one or more further connectors for simultaneously connecting to further terminals. Each connector may be included on a different module that interfaces with at least one, but preferably a plurality, of terminal pairs, in other words a different line card. The line cards may be connected to each other in a daisy chained manner, but may be separated from each other, as they are provided on different printed circuit boards. The device may include a controller unit that communicates with a line card of the plurality of line cards. The controller unit configures a line card to either transmit or listen for data.

The device of the first, second or third aspect of the invention may be referred to as a listening or receiving device, while the device of the fourth aspect of the invention may be referred to as a talking or transmitting device. The device of the first, second or third aspect of the invention and the device of the fourth aspect of the invention may be the same device configured to be either a listening/receiving device or alternatively a talking/transmitting device. The device may be selectively configured as either listening/receiving device or alternatively a talking/transmitting device by a portable computing device to which the device is in wired or wireless communication. The portable communication device may, for example, be a laptop computer, a smart phone, a tablet device, or any other general computing device capable of running specialised software.

A fifth aspect of the present invention provides: a system for assessing telecommunications wiring between a first plurality of terminals and a second plurality of terminals, wherein the system includes:
  a first device according to any one or more of the first, second or third aspects of the present invention; and
  a second device that is operable to be in electrical communication with the second plurality of terminals to transmit the terminal identification data onto each of the second plurality of terminals.

Preferably, the second device is configured to generate different signals for respective terminals of the second plurality of terminals, each signal encoding different terminal identification data.

Preferably, the second device is the device of the fourth aspect of the present invention.

In one embodiment, at least one of the first and second devices is grounded to assist in an ability for first device to detect that a wire connected to a terminal of the first device is short circuited to ground.

In any of the above aspects of the invention, having different terminal identification data for each terminal enables the mapping of the telecommunications wiring to be identified on a terminal-by-terminal basis. The assessment can include verification of an expected mapping between the first plurality and the second plurality of terminals. In one embodiment the assessment verifies sequential (eg one-to-one) mapping between the first plurality and second plurality of terminals. Additionally or alternatively, the assessment can include mapping of electrical connections between the first plurality and second plurality of terminals.

The terminal identification data preferably includes data that defines a terminal number that is dependent on a position of that terminal in comparison with other terminals in the second set of terminals. The first plurality of terminals and the second plurality of terminals are preferably arranged as pairs of terminals, wherein each terminal pair is configured for electrically connecting to respective wires of a twisted wire cable (referred to herein an "A" wire and a "B" wire, or an "A-leg" and "B-leg"). The first plurality of terminals may be arranged in a row that is parallel and opposing the row of the second plurality of terminals. The first plurality of terminals may be referred to as an "A row" and the second plurality of terminals may be termed as a "B row" (or vice-versa), whereby each wire (A and B) in a twisted wire cable is intended to be connected to a corresponding one of the rows (ie the A row or the B row) at the same longitudinal position along the rows (ie at the same terminal number).

Accordingly, the terminal identification data may also include data that defines which wire of a twisted wire cable the terminal is intended to be connected to, ie whether the terminal is an A terminal belonging to the A row or a B terminal belonging to the B row. The identification data may be included in a signalling scheme that includes additional information, such as information for error checking, eg a Cyclic Redundancy Check (CRC). For data that defines at least a portion of a given pair ID (ie telecommunication line ID), a symbol used to encode the data if the data is for an A terminal is complementary to a symbol used to encode the data if the data is for a B terminal. For a given terminal pair, the symbols for each terminal of the terminal pair are complementary to each other, so the data can be transmitted as a differential signal over a pair of wires connected to the terminal pair. The pairs of wires have differential signalling so that there is no net signal when the pairs are added together. This reduces the interference between sets of pairs which is important in multi-pair cables when signals are transmitted on all pairs simultaneously and are decoded simultaneously, as may be the case with the present invention.

In one embodiment pair ID data is transmitted in a data packet, which may include a plurality of symbols. Preferably, over the course of the data packet, the total number of transmitted 1's is equal to the total number of transmitted 0's. Preferably, each symbol in the data packet has a complementary number of 0's and 1's to the number of 0's and 1's in any preceding or following symbol in the data packet.

Hence, the average voltage (ie DC level) of the transmitted signal is the midway voltage between the highest and lowest voltage of the transmitted signal, which is half of the peak voltage if the signal is received as a unipolar signal, or 0 volts DC if the signal is received as a bipolar signal. The balanced signalling (equal number of 1's and 0's) means that there is no need to have a separate common signalling ground reference, as the signalling reference may instead be is derived from the net DC level of all of the transmitted signals. The terminals are preferably AC coupled to at least one and preferably both of the receiving and transmitting devices.

The device of the first, second or third aspect of the invention may be configured to receive at least two data packets having identical data before terminal identification data in the data packet is accepted by the device.

The device of the first, second or third aspect of the invention may be configured to analyse signals received on the first plurality of terminals by decoding any one received signal independently from decoding of any other received signal. Thus, decoding of a signal received on one of an A or B terminal can occur regardless of whether a signal is received on the other of the A or B terminal. This enables individual wires to be assessed even in cases where a twisted wire pair is split between two different terminal numbers (eg an A wire being connected to an A or B of terminal number $T_n$, while the corresponding B wire is connected to an A or B terminal of terminal number $T_m$. By contrast, this could not occur if the A and B terminals were measured differentially.

In one embodiment, the signalling scheme defines that signals for A terminals contain a distinct pattern that never occurs for the signals for the B terminals, thus enabling a received signal to be identifiable as being either a signal for an A wire or a signal for a B wire, regardless of whether the signal is received at an A terminal or a B terminal of the first plurality of terminals.

In one embodiment the first plurality of terminals is connected to a first end of a cable and the second plurality of terminals is connected to an opposite end of the cable. The cable may be a connecting cable between a fibre-to-copper interface cabinet (eg a fibre-to-the-node cabinet) to a copper-based (copper wire to copper wire) cross-connection interface, such as copper pillar, in a telecommunications network. The cable may be for connecting a customer side of the copper-based cross-connection interface to a customer side of the fibre-to-copper interface cabinet. Another cable, like the first cable, may be for connecting an exchange side of the copper-based cross-connection interface to a Plain Old Telephone Service (POTS) only portion of the fibre-to-copper interface cabinet.

The present invention also includes methods corresponding to any one of the devices or systems described herein. For example, synonymous with the first aspect of the present invention, in a sixth aspect of the present invention there is provided a method for assessing telecommunications wiring between a first plurality of terminals and a second plurality of terminals, the method including:

decoding terminal identification data received on each of the first plurality of terminals, wherein, for each terminal of the first plurality of terminals, the received identification data is specific to a single terminal of the second plurality of terminals.

The method may first comprise transmitting the terminal identification data onto each of the second plurality of terminals.

Preferably, a time taken for the device to transmit terminal identification data onto all of the second plurality of terminals is fixed.

The method may further include:

connecting a plurality of contacts of a first device to the first plurality of terminals, respectively;

connecting a plurality of contacts of a second device to the second plurality of terminals, respectively, wherein:

the first device is a device in accordance with any one or more of the first, second or third aspects of the present invention; and/or the second device is a device in accordance with the fourth aspect of the present invention.

In one embodiment, the first plurality of terminals and/or the second plurality of terminals is at an end of a tie-cable, which is preferably a one-to-one tie cable. The method may further include connecting the first plurality of terminals and/or the second plurality of terminals to the wires that route through the tie cable.

In one embodiment, at least one of (i) the first plurality of terminals and (ii) the second plurality of terminals, are respectively connected to a third plurality of terminals and fourth plurality of terminals, the third plurality of terminals and fourth plurality of terminals each being at an end of a tie-cable (preferably, a one-to-one tie-cable).

In a seventh aspect of the present invention there is provided a method to be performed in a telecommunications network, the method including:

routing the cable underground between a cross-connection interface and an optic fibre-to-copper interface;

after routing the cable underground, electrically connecting a terminal block to a plurality of twisted-wire pairs at a first end of the cable for connecting the cable to a first location, being either the cross-connection interface or the optic fibre-to-copper interface;

after electrically connecting the terminal block, transmitting terminal identification data onto terminals at a second terminal block at a second location, being the other of the cross-connection interface or the optic fibre-to-copper interface;

receiving the terminal identification data at terminals at the first location, from terminals at the second location; and correlating the terminals at the first location with the terminals at the second location, based on the terminal identification data.

An eighth aspect of the present invention provides a device for assessing telecommunications wiring between a first plurality of terminals and a second plurality of terminals, the device being operable to be in electrical communication with the first plurality terminals for at least one of transmitting and receiving terminal identification data on each terminal of the first plurality of terminals, wherein the device includes a connection means for electrically connecting to a first portion of the first plurality of terminals, wherein the device is expandable to include one or more further connection means for simultaneously connecting to further portion of the first plurality of terminals.

Each connection means may be included on a different line card. The line cards may be configured to be connectable to each other in a daisy chained manner. The connection means may be a plurality of contacts on or attached to a printed circuit board. The device may include a controller unit that communicates with a line card of the plurality of line cards. The controller unit configures a line card to either transmit or listen for data. Optionally the device may be selectably configurable to operate as device in accordance with (i) any one or more or the first, second and third aspects of the present invention; or (ii) a device in accordance with the fourth aspect of the present invention.

The device of the eighth aspect of the invention may have the features of any one or more of the first, second or third aspects of the invention, or may have the features of the fourth aspect of the invention.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

DETAILED DESCRIPTION OF THE EMBODIMENTS

Figure 1:
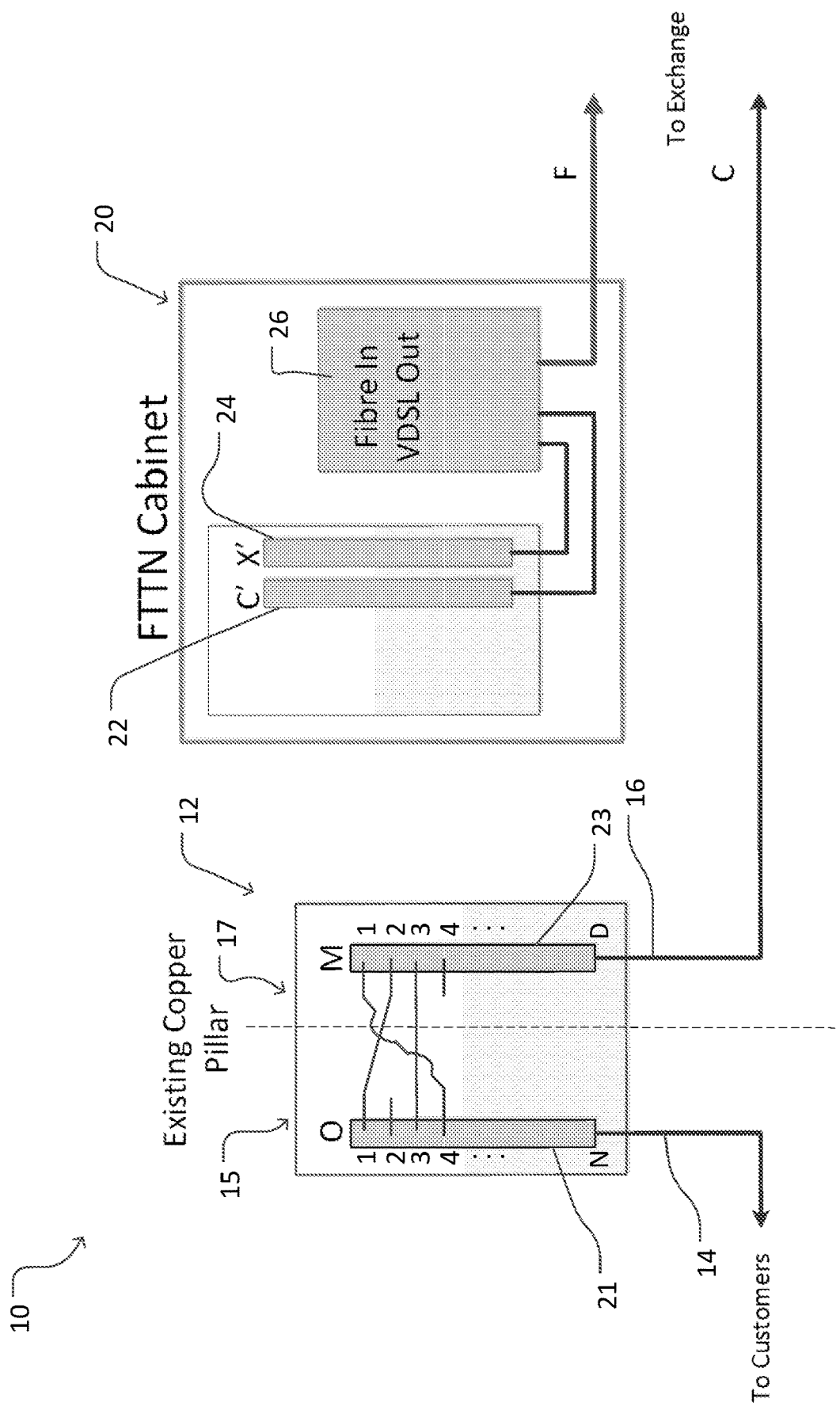
FIG. 1 is a block diagram depicting a part of a telecommunications network having a copper-wire cross-connection interface and an optic fibre-to copper wire interface that is to be connected to the copper-wire cross-connection interface.
Figure 2:
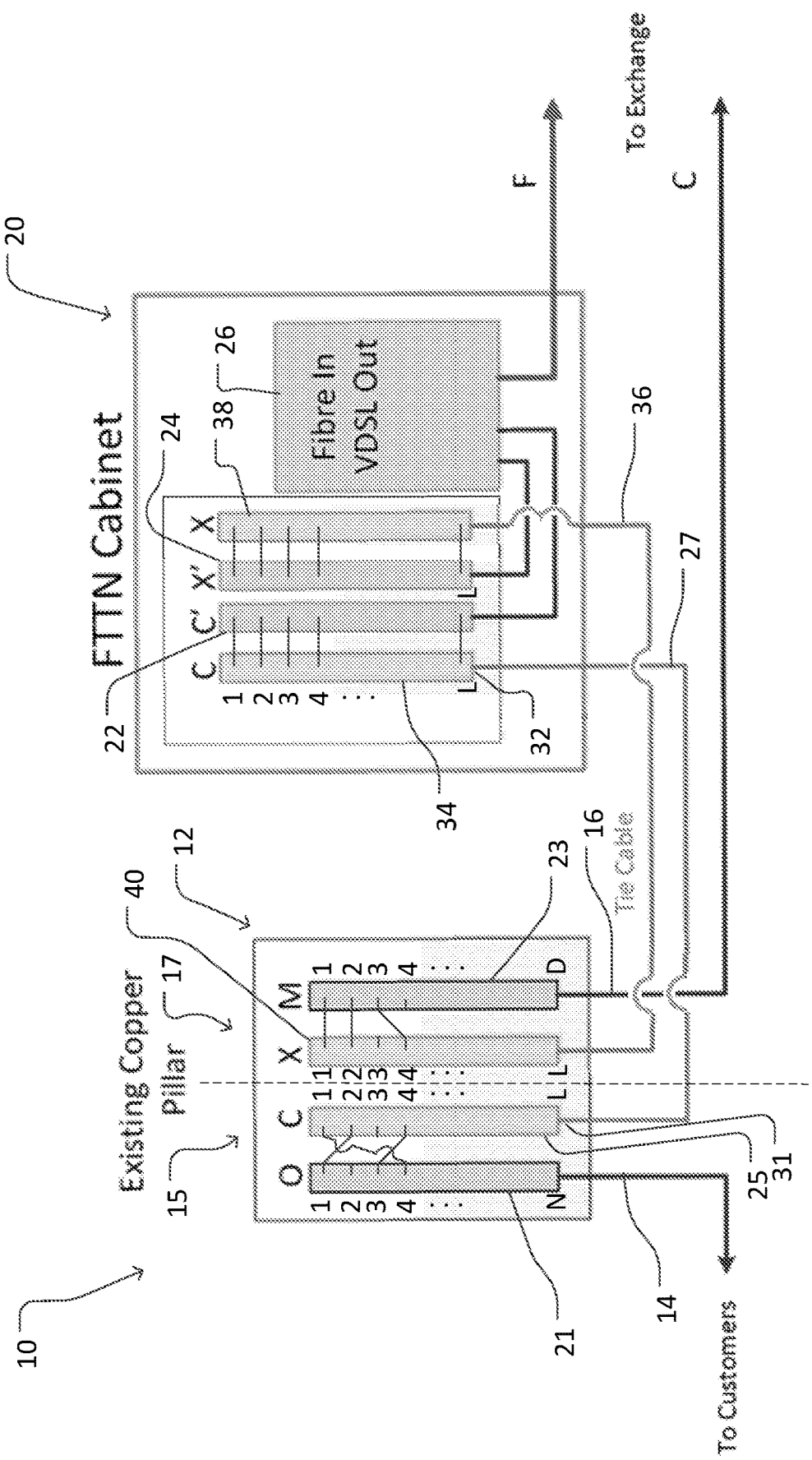
FIG. 2 a block diagram depicting the part of a telecommunications network of FIG. 1, but in which the copper-wire cross-connection interface and an optic fibre-to copper wire interface are connected to each other by tie-cables.
Figure 4:
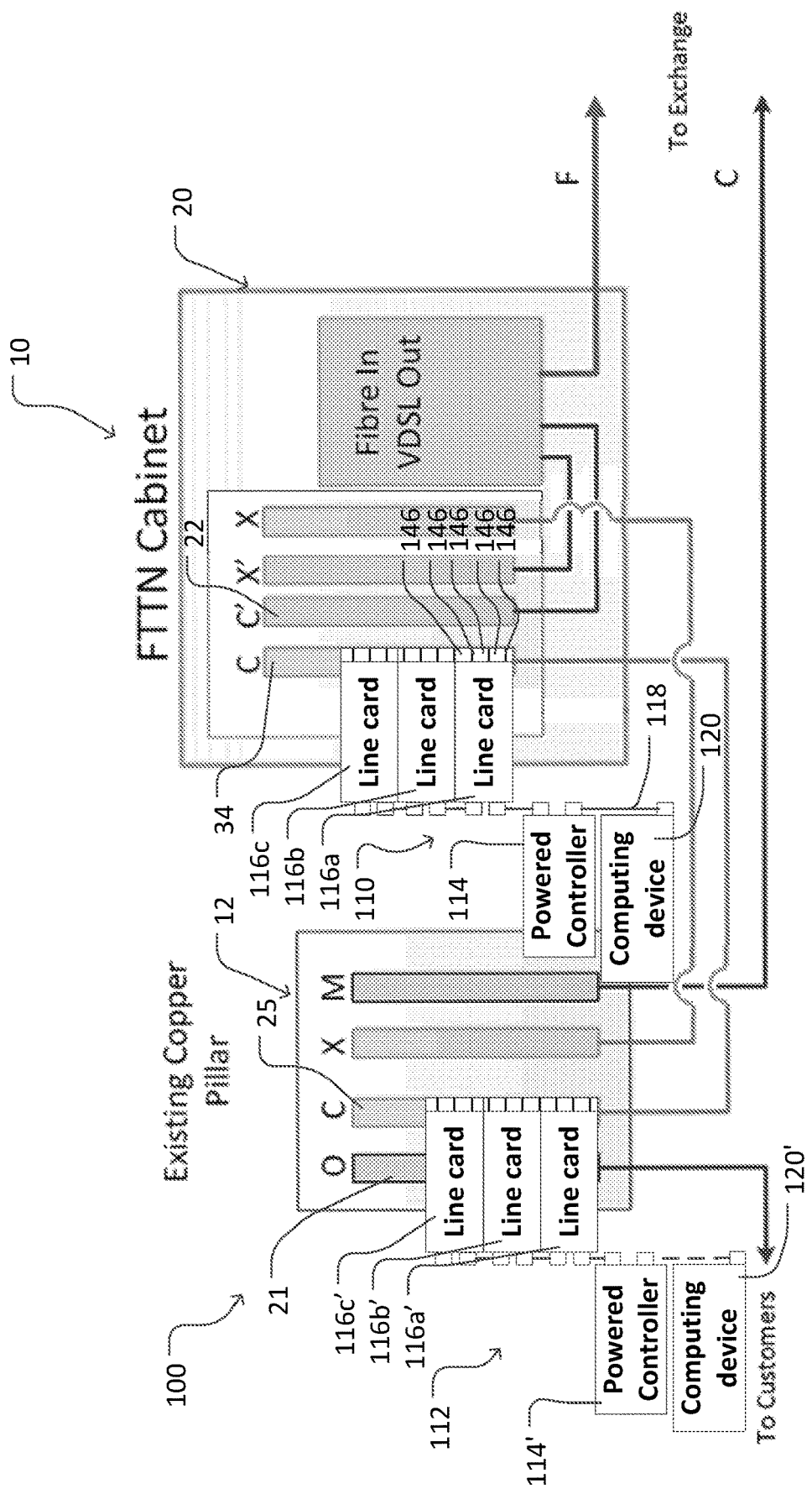
FIG. 4 is a block diagram depicting the part of a telecommunications network of FIG. 2, but with a telecommunications wiring assessment system having a talking device and listening device respectively connected to the second plurality of terminals and first plurality of terminals referred to above, in relation to FIG. 3.

An exemplary telecommunications wiring assessment system 100 in accordance with the present invention is depicted in FIG. 4. The assessment system 100 is depicted connected to a part of a telecommunications network 10 having the same features as illustrated and described in relation to FIG. 2. However, it will be appreciated that the present invention can also be applied to other parts of a telecommunications network. It can be especially useful when installing any kind of telecommunications infrastructure wiring, including digital network wiring, eg for an Ethernet network and/or for accessing the Internet.

As will be described hereinafter a "plurality of terminals" will generally be used in reference to terminal blocks relative to a cross-connection interface or a fibre to copper-wire interface. However, it will be appreciated that a "plurality of terminals" may take other forms when applied to other parts or forms of a communications network. For example, a plurality of terminals may be considered the eight terminals of an RJ45 connector in CAT-7 cable for accessing an Ethernet network and the Internet. Further "a plurality of terminals" may be comprised of terminals from a plurality of such cables. However, in any case, a "plurality" of terminals will generally be more than two terminals, and for some applications could be defined as at least eight terminals.

The system 100 has a first device 110 and a second device 112 respectively connected to the optic fibre-to-copper interface 20 and the cross-connection interface 12 of the part of a telecommunications network 10.

The first device 110 has a controller unit 114 and at least one, in this case three, line cards 116 (a, b, c). The controller 114 unit has a wired connection 118 to a computing device 120 to transfer data from the controller unit 114 to the computing device 120 or from the computing device 120 to the controller unit 114. In other embodiments (not shown) the communication between the controller unit 114 and the computing device 120 may be a wireless form of communication e.g. WiFi, BlueTooth, 3G, 4G or any other form of wireless communication suitable for communicating digital data. In yet other embodiments, the computing device 120 may be incorporated into the controller 114, or the controller 114 may be incorporated into the computing device 120.

The portable communication device may be a laptop computer, a smart phone, a tablet device, or any other general computing device capable of running specialised software. The portable computing device will generally include a processing system, memory, which includes non-transient memory for storing instructions to be executed by the processing system. The portable computing device will also generally include: a power source (eg a battery); a graphical user interface; and a user-input interface such as a keypad, which may be integrated onto the graphical user interface by way of a touchscreen. The portable computing device will also generally include wireless communications functionality, eg WiFi, and/or BlueTooth, 3G, 4G etc, and/or a wired communications functionality, eg USB. This can be used by the computing device 120 to connect with the first device 110 and/or the second device 112, and/or with other devices.

The second device 112 has the same components as the first device 110, ie at least one line card, in this case three line cards 116' (*a, b, c*) and control unit 114', which can be identical to line cards 116 (*a, b, c*) and control unit 114, and is connected to a computing device 120'. The connection from the control unit 114' to the computing device 120' may be a wired or wireless connection, but need only be connected during initialisation of the second device 112. During initialisation of the system 100, the second device 112 is configured by the computing device 120' to act as a "talking" device which sends data to the first device 110 which is configured by computing device 120 to act as a "listening" device. Optionally, after configuring the second device 112, the computing device 120' may be disconnected from the second device 112 and then connected to the first device 110 to assume the function of computing device 120.

Optionally, the devices 112 and 110 can be configured in the opposite manner whereby the first device 110 acts as the talking device and the second device 112 acts as the listening device. However, hereinafter in the specification, the first device 110 should be taken to be the listening device and second device 112 should be assumed to be the talking device, unless otherwise stated or implied.

Figure 5:
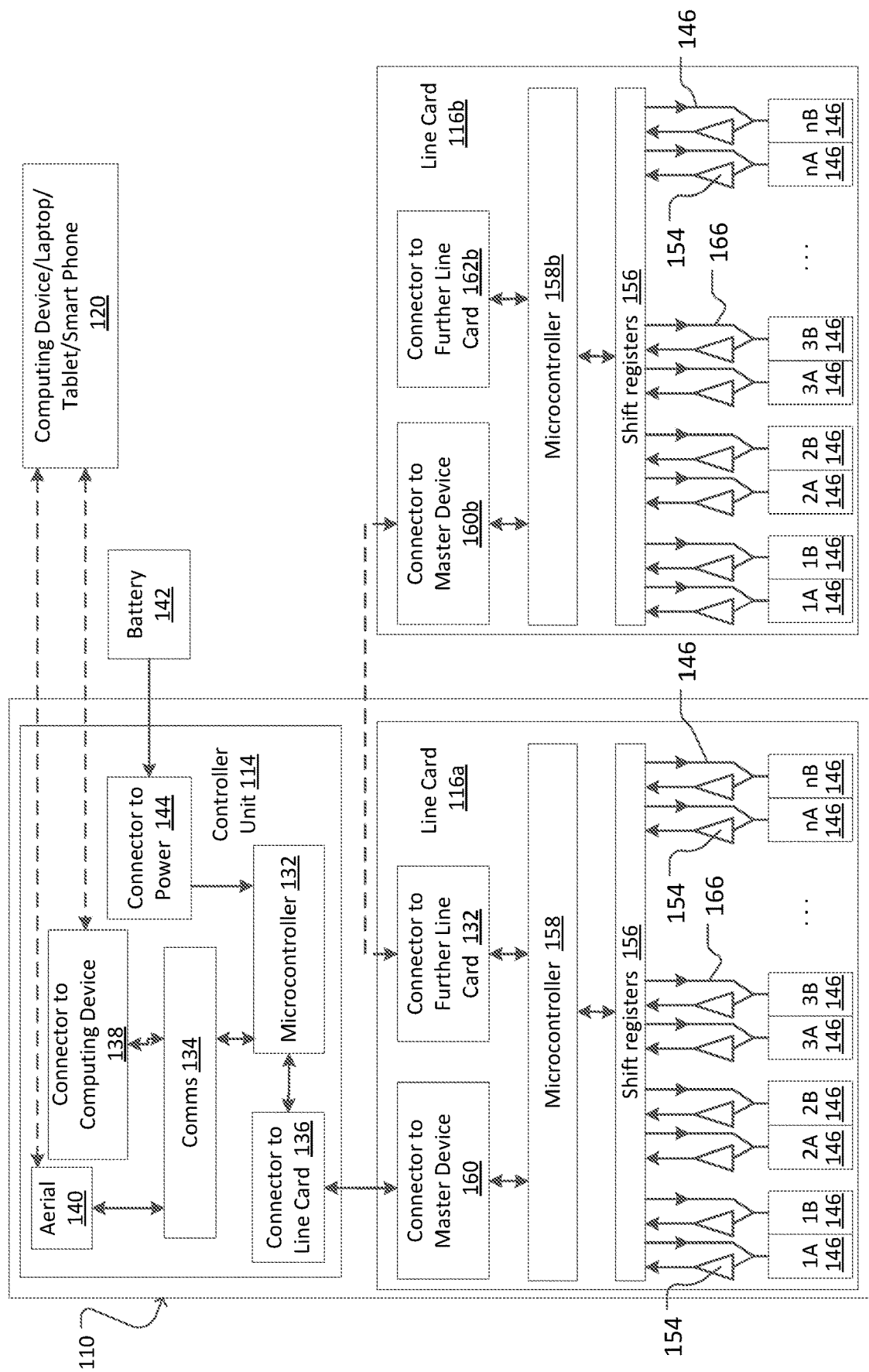
FIG. 5 is a block diagram illustrating the conceptual components of the listening device (or talking device) of FIG. 4.

Details of the device 110 are illustrated as a conceptual block diagram in FIG. 5. In its most basic form, device 110 includes a controller unit 114 and a single line card 116*a*. However, the device 110 is expandable to include at least one further line card 116*b*. Although only one further line card is depicted in FIG. 5, more line cards may be included, as shown in FIG. 4, which illustrates multiple line cards connected to each other in a daisy-chained manner.

The controller unit 114 includes a microcontroller 132 having a processing unit and a memory unit, whereby the memory unit stores instructions that are executable by the processing unit. The instructions are stored in non-transient memory of the memory unit so as to be retained when the device 110 is not powered. The memory unit also includes transient memory for temporarily storing data derived during operation of the device 110, and which is lost when the device is unpowered. Optionally, some data derived during operation may be stored in the non-transient memory. In other embodiments, rather than being included in a microcontroller, the processing unit and memory unit may form separate devices. Further both the processing unit and the memory unit may each be comprised of multiple processing or memory devices, respectively.

The microcontroller 132 communicates with (or includes) a communications unit 134 configured for communicating with the computing device 120, by wired connection via connector 138 and/or by wireless connection via aerial 140. The microcontroller 132 also includes communications functionality to communicate with the line card 116*a* via connector 136. The microcontroller 132 and communications module 134 (if it is separate to microcontroller 132) receives power from an external battery 142 via connector 144, the power being distributed via a power management circuit (not shown) which typically includes some filters and voltage regulation circuitry. In other embodiments, however, the battery 142 is an internal battery, included in the controller unit 114. The battery may, in this case, be charged via the connector 138. The connector 136 conveys power from the controller unit 114 to the line card 116*a*.

Each line card 116 (116*a*, 116*b* and 116*c*) can be identical to each other, each being a modular electronic device for interfacing with at least one pair (but preferably a plurality of pairs) of terminals in a terminal block. The terminal block to which a given set of line cards 116 (*a, b, c*) are connected may be any one of the terminal blocks illustrated in FIG. 4, ie terminal block 21, 25, 40, 23, 34, 22, 24 or 38. To connect with terminals of such a terminal block, each line card 116 has a plurality of contacts 146, arranged into pairs.

To interface with n terminal pairs, a given line card 116 has 2n electrical contacts 146. The contacts 146 are grouped into pairs of contacts, whereby the contacts in a given contact pair are intended for electrically connecting to respective terminals of a terminal pair on a terminal block. One contact of the pair is designated as an "A" contact and the other contact is designated as a "B" contact, for respectively connecting to an "A" terminal or "B" terminal of a pair of terminals within the terminal block. Thus, the contacts of the line card are ordered 1A, 1B, 2A, 2B, 3A, 3B, and so on until nA and nB. The contacts 146 are illustrated, conceptually, in FIGS. 4 and 5, but for simplicity FIG. 4 shows only some of the contacts 146 illustrated in FIG. 5.

Figure 6:
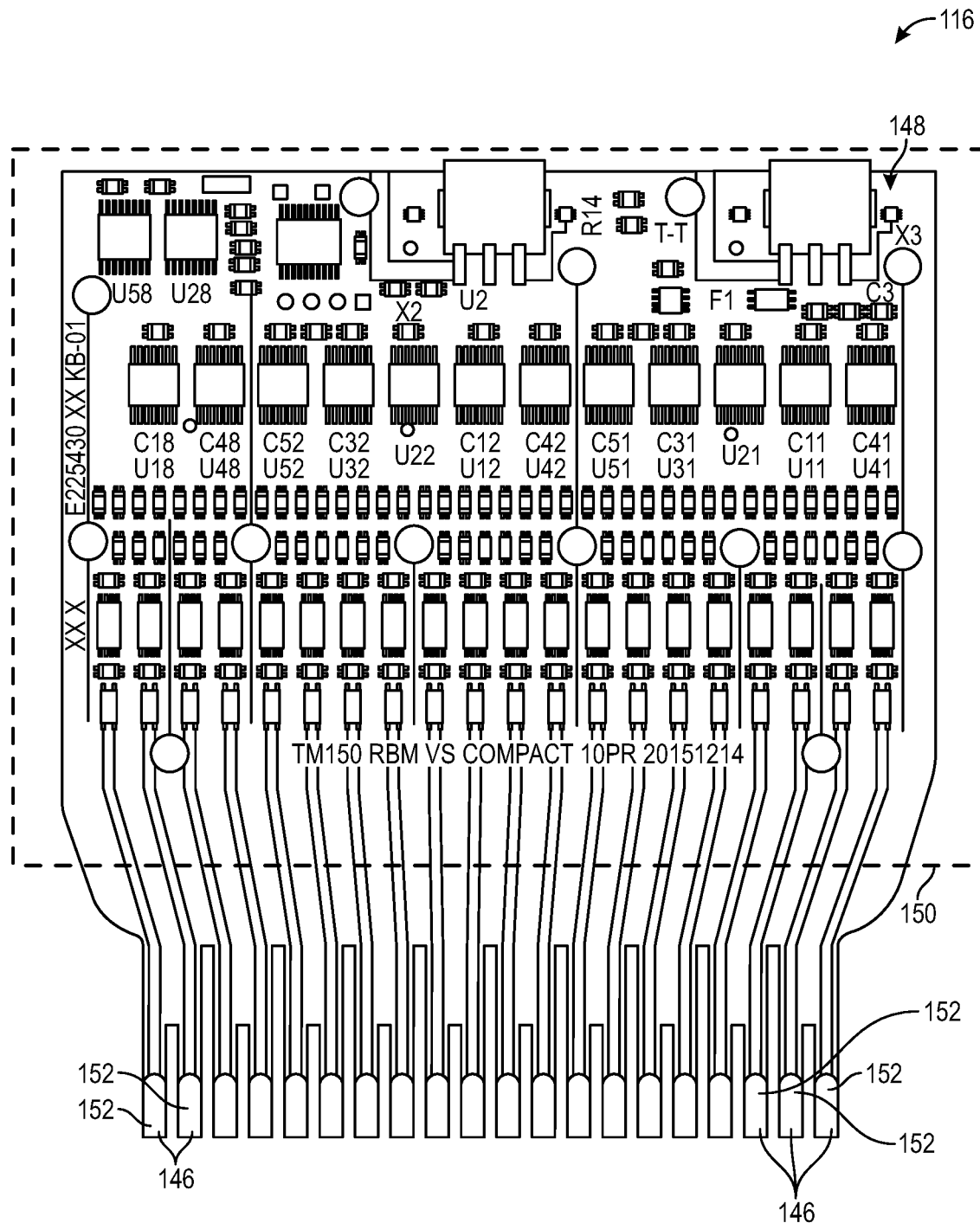
FIG. 6 is a picture of a line card, at least one of which is included in the talking device and at least one of which is included in the listening device of FIGS. 4 and 5.

Electronic components of each line card 116 are on a corresponding printed circuit board (PCB) 148, a picture of which is included in FIG. 6. The PCB 148 is held within a housing 150, which is depicted conceptually in FIG. 6, by broken lines. Extending from the housing 150 are a plurality of fingers 152, each finger 152 bearing one of the contacts 146 of the line card 116. In the example shown in FIG. 6, there are 20 fingers 152 for respectively bearing 20 contacts 146 (although only 5 of the fingers and contacts are marked with reference numerals 146 and 152).

In the embodiment illustrated in FIG. 6, each contact 146 is a conductive track of the printed circuit board 148. The contacts 146 of a given line card 116 are configured in a row, and are spaced and sized to connect with adjacent terminals of the corresponding terminal block to which it is to be connected. To mate with the terminals at an end of a typical tie cable, adjacent contacts 146 are configured such that the centre of each contact is spaced from its adjacent contacts such that it can mate with a specific connector. For one commonly used connector at cross-connection interfaces, adjacent contacts are spaced by 4 mm. In another embodiment, in which the invention is used for digital network cabling, the contacts may be spaced to connect with respective terminals (ie contacts) of an RJ45 connector.

In addition to contacts 146, the PCB 148 holds other electronic components, depicted conceptually in FIG. 5. As shown in FIG. 5, each contact 146 is electrically connected to an input of a comparator 154 that is dedicated to that contact and which is used to detect signals received on that contact. Each comparator compares the voltage of the input from its corresponding contact 146 with a voltage that is half of the peak voltage signal expected to be received on the contact 146, measuring the voltage signal as a unipolar signal. Thus the line card 116 treats the signals it receives from each of its contacts as being single-ended, as opposed to differential. Since each contact receives its own dedicated comparator 154, a signal received on a given contact 146 can be decoded irrespective of whether a signal is received on the other contact 146 of the relevant contact pair.

The comparators 154 feed into one or more shift registers 156 which serialise any data received on the respective contacts 146 and transmit the serial data to a microcontroller 158. The microcontroller may have the same features as the microcontroller 132 or, similarly, may be a processing unit/system and separate memory. The microcontroller 158 transmits the serial data, via connector 160, to a master device, which for the line card 116a is the controller unit 114. The controller unit 114 then, in turn, transmits the data received from the line card 116a to the computing device 120, where the data may be analysed by an operator via a graphical user interface on the computing device 120.

The line card 116a also includes a connector 162 for connecting to a further line card 116b. The further line card 116b has the same features as the first line card 116a, and it is connected to first line card 116a via the connector 160b. In this case, the first card 116a acts as a master device for the further line card 116b. The first line card 116a configures the second line card 116b, as will be described. Any data received by line card 116b from its contacts is transmitted from microcontroller 158b of second line card 116b back to first line card 116a and then onto controller unit 114. This is achieved by the first line card 116a claiming access to the serial bus that is transmitted from microcontroller 158 of first line card 116a, back to the controller unit 114.

Further line cards, not shown in FIG. 5, may be connected to further expand the device 110. To connect up a third line card, the connection to the third line card is via connector 162b on line card 116b, and yet further line cards can be connected in the same fashion. Thus, when a plurality of line cards are employed, the line cards are connected in a daisy-chain manner.

When data from a contact 146 is received by a microcontroller of a line card 116, the microcontroller identifies the contact of the 2n contacts on which the data was received. The identification of the relevant contact can be established based on where the data occurs within the stream of data from the shift registers 156 of that line card.

In another embodiment, the identification of which data corresponds to which contact is determined by the microcontroller 132 of controller unit 114, or in a further embodiment, by a processing unit on the computing device 120.

During configuration of the device 110, device 110 receives configuration data from the computing device 120, which defines whether the device 110 is to act as a listening (receiving data via contacts 146) device or a talking device (transmitting data via contacts 146), like device 112. If a line card is configured for talking rather than listening, the microcontroller 158 of the line card is configured to transmit data that it receives via connector 160 to one or more shift registers 156. The shift registers 156 then divide out and distribute that data, via tracks 166, to the relevant contacts 146 to which the data relates.

In addition to identifying whether the device is to act as a listening or talking device, the configuration process also provides the line card with a terminal identifier to identify which terminal within a terminal block the first contact 1A of first line card 116a is or will be connected to. For example, if the line card 116a is inserted such that its first contact 1A is in contact with the first terminal of a given terminal block, the assigned terminal identifier will identify terminal 1A. The terminal number assigned to the first terminal 1A is manually entered by an operator of the device 110 during configuration, the operator having visually identified which terminal in the terminal block the first terminal 1A is connected to. The terminal identifier therefore depends on the location of the terminal within the terminal block. The identifier may be defined as a number being between 1 and 2n, whereby terminals 1A, 1B, 2A . . . nB are respectively referenced as identification numbers 1, 2, 3 . . . 2n. Alternatively, the identifier may define a number 1 to n and a specific terminal within the corresponding terminal pair, i.e. an "A" identifier or a "B" identifier, so that terminals 1A, 1B, 2A . . . nB are identified, more directly, referenced as 1A, 1B, 2A . . . nB, respectively.

Since it is known how many terminals are included in first line card 116a (specifically 2n terminals), during configuration, microcontroller 158 of first line card 116a tells microcontroller 158b of second line card 116b to assign a terminal identifier that is corresponding to the next terminal in the sequence of terminals. In the example of FIG. 5, the terminal 1A of the second line card 116b will be identified as either (i) the terminal number designation that was assigned to terminal 1A of line card 116a, plus 2n (if the terminals are identified by only a single number), or (ii) the terminal and pair designation plus n (if the terminals are identified by a terminal number and pair identifier).

Before or after (but preferably before) configuring listening device 110 in this manner, talking device 112 is configured based on the same principles. Once configured the talking device 112 communicates data in a free-running mode, until it is deactivated or turned off. Once the configuration of talking device 112 has been established, communication between the talking device 112 and the computing device 120' can optionally then be disconnected, and used as device 120 for connection with listening device 110.

In a preferred method of operation, the devices 110 and 112 are used to verify whether there is a one-to-one connection between the terminal blocks to which the respective devices 110 and 112 are connected. In other words the intention is to verify that the terminal number of one terminal block is electrically connected to the same terminal number of the other terminal block, and preferably the terminal within the terminal pair is also the same (ie the A terminal is connected to the A terminal, and the B to the B). Therefore, during use, the talking device 112 and listening device 110 will generally be set up to connect the first contact 1A of the respective talking device 112 and the first contact 1A of the listening device 110 to the equivalent terminals (for example, the first terminal) in the respective terminal blocks.

During operation of system 100, talking device 112 transmits, from each contact 146, data that includes terminal identification data. The terminal identification data includes the terminal identifier that has been assigned to that contact 146. The terminal data is transmitted using a custom designed signalling scheme. In one example, 3b5b signalling scheme is employed. The A and B leg signals for a given pair are complementary at the talking device, but the A and B leg signals are not received differentially, by the listening device 112, but rather, individually relative to the group average (or ground if available). The signals transmitted on an A terminal (the A signals), all contain a distinct pattern that never occurs within signals transmitted on a B terminal (the B signals) and vice versa. Hence, the A signals can always be discerned from the B signals, regardless of the contact 146 on which they are received.

The signal on each leg is a repetition of 8, 5-bit symbols or 40 bits repeated. Bits are sent using Non-return-to-zero (NRZ) code at 400 bits per second. The first two symbols, taken together form a synchronization mark and also encode the A-leg/B-leg identity of the source (ie the contact 146 from which the signal is transmitted). The next five symbols each encode 3 bits of the pair identification (ie pair number), allowing 32,768 (ie $2^{5\times 3}$) distinct pairs to be identified. The last symbol before the pattern repeats is a 3 bit Cyclic Redundancy Check (CRC), allowing some errors to be detected. As each 5-bit symbol encodes only 3 bits of pair identification data, this provides considerable redundancy in the symbol encoding, which allows a greater ability to detect errors. A defined multiple number of copies (eg 2 copies) of a packet passing the above checks and containing the same data must be received by the listening device 112 before the data is accepted, further strengthening the error detection performance.

As an exemplary encoding scheme in accordance with the signalling scheme described above, the identification of whether a terminal corresponds to an A terminal or a B terminal is defined by the following data in the two synchronisation symbols:

| Terminal A/Terminal B | Symbol 1 | Symbol 2 |
| --- | --- | --- |
| A | 10000 | 11110 |
| B | 01111 | 00001 |

As can be seen from the table above, the data to identify that the data packet is for an A terminal is complementary to the data to identify that the packet is for a B terminal. Also the number of 0's and the number 1's in the first symbol is equal to the number of 1's and the number 0's, respectively, in the second symbol. Thus, over the course of the two symbols, the bits average to a midway voltage, half way between the high and the low voltage of the signal, ie 0V for a bipolar signal or 0.5 Vpeak for a unipolar signal. Indeed, the same average (ie the midway voltage) occurs over the course of the 8 symbols of the data packet. In other words, over the course of the data packet, the total number of 1's is equal to the total number of 0's. This occurs regardless of what terminal information is encoded by the symbols.

Having an equal number of 1's and 0's over the course of the data packet is achieved by having each even numbered symbol having a complementary number of 0's and 1's to the number of 0's and 1's in each odd numbered symbol. So, for example, the third, fifth and seventh symbols (ie odd symbols) may have three 1's and two 0s', in which case, the fourth, sixth and eighths symbols (ie even symbols) will have three 0's and two 1's. Further, there are an even number of symbols in total, so the number of 0's and number of 1's will always be balanced.

Additionally, the encoding for an A terminal is complementary to the encoding for the B terminal. For example, if the first 5-bit data symbol (eg for encoding bits 1 to 3 of a terminal pair/telecommunication line ID) is 00101 for an A terminal, then it would be 11010 to encode the same 3 bits were it encoding a B terminal.

The table below defines how the 3 bits of the pair identification (ID) data is encoded by 5 bits of symbol data, whereby the meaning of the pair ID data is dependent on whether the data is encoding an A or B terminal, as determined by the synchronisation symbols.

| Encoded Data (eg for identifying a terminal pair) | if encoding an A terminal and the symbol number is even, or if encoding a B terminal and the symbol number is odd. | if encoding a B terminal and the symbol number is even, or if encoding an A terminal and the symbol number is odd. |
| --- | --- | --- |
| 000 | 10001 | 01110 |
| 001 | 10010 | 01101 |
| 010 | 00101 | 11010 |
| 011 | 00110 | 11001 |
| 100 | 01001 | 10110 |
| 101 | 01010 | 10101 |
| 110 | 01100 | 10011 |
| 111 | 10100 | 01011 |

As can be seen in the table above, for a given 3 bits of encoded data, the symbol used to encode the data if the data is for an A terminal is complementary to the symbol used to encode the data if the data is for a B terminal. For a given terminal pair, the symbols used to encode the A and the B terminal are complementary to each other, so data transmitted over a given pair is a differential signal. However, additionally, each of the A and B terminals encodes data that can be considered independently of the other, ie as a single-ended signal. In this manner, individual wires can be identified independently from each other. This is aided by having the average voltage of transmitted signal on each terminal being the midway voltage between the highest and lowest voltage of the transmitted signal, as it enables the average voltage to be used as a reference for measuring each single ended output.

Furthermore the maximum run length of the encoded data (and the synchronisation data) is a run of 4 bits, which simplifies electronics and timing recovery. Moreover because the synchronisation symbols are different to the encoded data symbols they are unambiguously distinguishable from each other. Finally the symbols on each of the A and B terminals are chosen so that each differs from each other by at least two bits, which can aid error correction.

The listening device 110 listens for data packets received on any of its contacts 146. The received data is decoded via single-ended inputs (ie the data is treated as though it corresponds to single ended data transmission, as opposed to differential data transmission). This is achieved by having the signals received on the contacts 146 feed to one input (the positive input) of respective comparators, while the average voltage of the transmitted signals (ie half of the peak voltage of the signal) is used as the reference input (the negative input) for the respective comparators 154. In this manner, the signals received on each of the contacts 146 are decoded independently from each other. Further, the signalling scheme between the talking device 112 and the listening device 110 is a one way communication, which does not require any handshaking or acknowledgement from the listening device.

To illustrate the operation of the system 100, reference will be made to the exemplary wiring examples depicted in FIGS. 3A-D, taking the first plurality of terminals as being connected to the listening device 110 and the second plurality of terminals to be connected to the talking device 112.

The talking device 112 transmits signals, via its contacts 146, onto each of the first plurality of terminals, identification data that identifies that terminal. Thus, for each of the illustrated examples, the four wires carry signals that convey identification data that defines, from the top illustrated wire to bottom illustrated wire, terminals 1A, 1B, 2A and 2B. These signals are received by respective contacts 146 of the listening device 110. In the listening device 110, or downstream, in the computing device 120, the received terminal identities of the second plurality of terminals are mapped against the terminal identities of the contacts that received the terminal identities of the second plurality of terminals, and the mapping is displayed to a user on the graphical user interface of the computing device 120. Additionally, the identity of each terminal of the first plurality of terminals is compared with the mapped terminal of the second plurality of terminals to identity whether the identities match or are different. A time stamp is generated, saved and displayed with the compared data to assist the operator in troubleshooting any mismatched terminals. The results of the wiring assessment may be saved and/or transmitted to another computing device, such as a third party server, to provide a record of the assessment, eg to prove that a one-to-one wiring between the first and second plurality of terminals has been verified.

In some cases, it may be that no data is received on a contact at the first plurality of terminals. It can be concluded that, for that terminal of the second plurality of terminals, there is no connection to the matching terminal of the first plurality of terminals. A first possible cause is there being no wire connected to that contact, or there is a wire connected to that contact but not connected to a terminal of the second plurality of terminals.

A second possibility is that a wire connected to the terminal is shorted to ground. Since the data received on each terminal is processed as single ended data, if a wire connected to that terminal is shorted to ground, this can potentially be detected by the receiving device because for that terminal no data will be received by the receiving device. The ability to detect the short can be further aided by having at least one, if not both, of the listening and talking devices connected to ground, thereby further inhibiting the appearance of a measureable voltage at that terminal.

A third possibility is that a wire is connected to that contact and to a terminal of the second plurality of terminals that is not connected to the talking device 112, and hence did not receive terminal identification data. This may occur if the talking device is only connected to only some of the terminals of a given terminal block, say terminal pairs 1-100 in terminal block of 200 terminals pairs, but not the relevant terminal (eg terminal "101A") that is wired to the relevant terminal of the first plurality of terminals (eg terminal "99B"). However, the relevant terminal 101A can be identified if the operator moves and reconfigures the talking device 112 to send terminal identification data onto terminal pairs 101-200 of the second terminal block, but leaves the listening device 110 connected to terminal pairs 1-100 of the first terminal block.

The listening device 110 is configured to detect the occurrence of no data being received on a contact at the first plurality of terminals. The device determines for each terminal whether, after listening for data for a set duration of time, data has been correctly received. In an event that data is not correctly received, the device generates an indication that the receipt of data failed. A person may then investigate the wiring to identify the cause of the failure, if necessary.

Figure 3A:
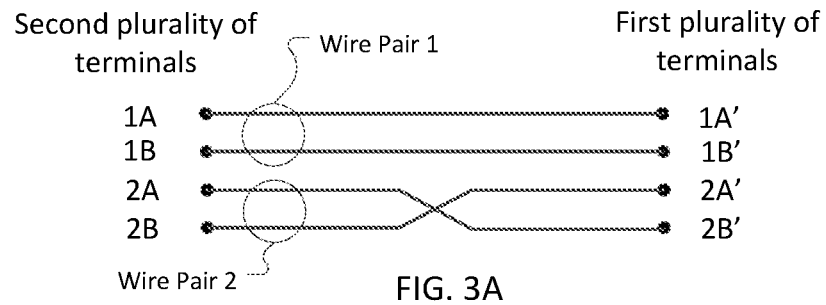
FIGS. 3A to 3D are diagrams illustrating interconnections between a first plurality of terminals at the optic fibre-to copper wire (eg at a first end of a tie cable), and a second plurality of terminals at the copper-wire cross-connection interface (eg at a second end of the tie cable)

Using the system and method described herein, in the case shown in FIG. 3A, terminals 1A' and 1B' will be verified as having matched wiring, while terminals 2A' and 2B' will be determined to be respectively to terminals 2B and 2A.

Figure 3B:
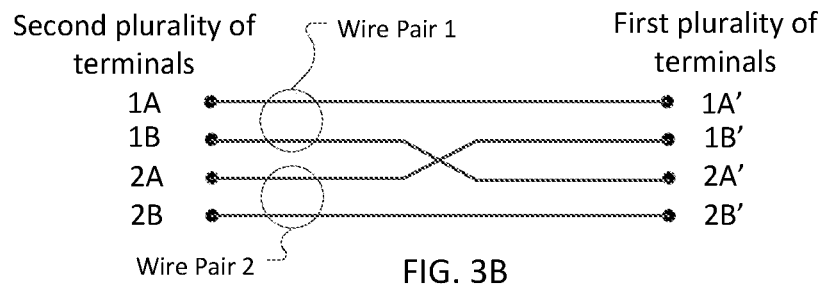

In the case shown in FIG. 3B, terminals 1A' and 2B' will be determined as having matched wiring, but terminals 1B' and 2A' will be determined to be incorrectly matched, being respectively wired to terminals 2A and 1B.

Figure 3C:
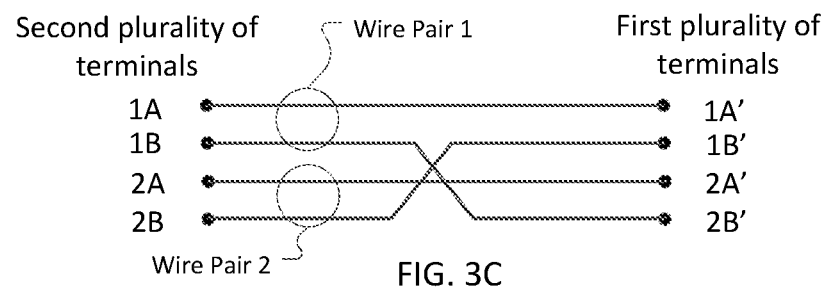

In the case shown in FIG. 3C, terminals 1A' and 2A' will be determined as having matched wiring, but terminals 1B' and 2B' will be determined to be incorrectly matched, being respectively wired to terminals 2B and 1B.

Figure 3D:
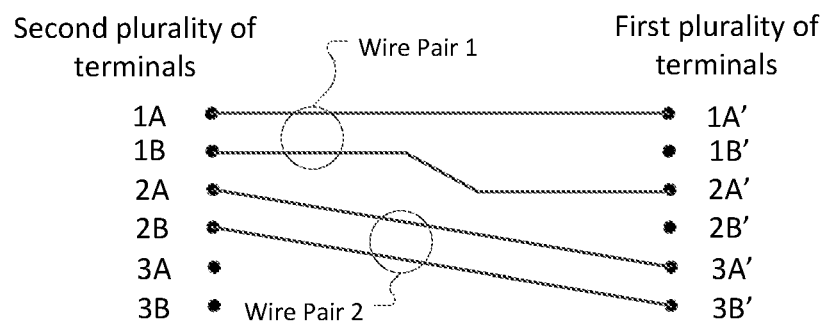

In the case shown in FIG. 3D, terminals 1A' will be determined as having matched wiring, terminals 1B' and 2B' will be determined as having an error or no connection, and terminals 2A', 3A' and 3B' will be determined to be incorrectly matched, being respectively wired to terminals 1A, 2A and 2B.

In these examples, the first plurality of terminals and the second plurality of terminals are at respective ends of a tie-cable, eg the first and second pluralities of terminals correspond to terminal block 34 and terminal block 25, respectively.

However, in other embodiments, the first plurality of terminals and the second plurality of terminals to the assessment system 100 is connected may be other terminal blocks in the network. For example, the first plurality and second plurality of terminals may correspond to terminal blocks 22 and 25, respectively, or may be terminal blocks 24 and 40, respectively. For these two additional examples, a one-to-one connection between a first and second terminal block can be verified in the same manner as described above.

It will also be appreciated that non one-to-one connections can also be identified and mapped between a first and second terminal block. However, to do this most effectively, it would generally be best for the assessment system 100 to be connected to all of the terminals of at least one of the first and second terminal blocks.

It will be understood that the invention disclosed and defined in this specification extends to all alternative combinations of two or more of the individual features mentioned or evident from the text or drawings. All of these different combinations constitute various alternative aspects of the invention.

The invention claimed is:

1. A device for assessing telecommunications wiring between a first plurality of terminals and a second plurality of terminals, the device being operable to be in electrical communication with the first plurality of terminals to listen for terminal identification data that is receivable on each of the first plurality of terminals, wherein the device is configured to decode, for each terminal of the first plurality of terminals, identification data that is specific to a single terminal of the second plurality of terminals and
   including a plurality of single-ended inputs for receiving signals from respective terminals of the first plurality of terminals,
   wherein the terminal identification data is transmitted in a data packet including a total number of transmitted 1's equal to the total number of transmitted 0's over the course of the data packet; and
   wherein the device is configured to determine a signalling reference derived from an average of net DC levels of the signals received on each of the other first plurality of terminals, each average DC level being a midway between the highest and lowest voltage of the signals received, the signalling reference used in decoding the identification data.

2. The device of claim 1 wherein the first plurality of terminals are arranged in pairs and the second plurality of terminals are arranged in pairs, each pair being for a different twisted pair of wires, wherein complementary signals received on two terminals of the first plurality of terminals are decoded to identify two different terminals of a same terminal pair of the second plurality of terminals.

3. The device of claim 1 which is grounded to enable said device to detect that a wire connected to the terminal is short circuited.

4. A system for assessing telecommunications wiring between a first plurality of terminals and a second plurality of terminals, wherein the system includes:
  a first device comprising the device of claim 1; and
  a second device that is operable to be in electrical communication with the second plurality of terminals to transmit the terminal identification data onto each of the second plurality of terminals.

5. The system of claim 4 wherein the second device is configured to generate different signals for respective terminals of the second plurality of terminals, each signal encoding different terminal identification data.

6. A device for assessing telecommunications wiring between a first plurality of terminals and a second plurality of terminals, the device being operable to be in electrical communication with the second plurality of terminals to transmit terminal identification data onto each of the second plurality of terminals, wherein the device is configured to generate different signals for respective terminals of the second plurality of terminals, each signal encoding different terminal identification data,
  wherein identification data is arranged according to one or more of the following:
    identification data is transmitted in a data packet including a plurality of symbols;
    identification data is transmitted in a data packet including a total number of transmitted 1's that is equal to the total number of transmitted 0's transmitted over the course of the data packet;
    identification data is transmitted in a data packet said packet including a plurality of symbols wherein each symbol in the data packet has a complementary number of 0's and 1's to the number of 0's and 1's in any preceding or following symbol in the data packet;
    an average voltage of the transmitted signal is a midway between the highest and lowest voltage of the transmitted signal to enable a signalling reference to be derived from a net DC level of a set of transmitted signals;
    a signalling scheme to be used in the case that the plurality of second terminals includes pairs of terminals each including an A terminal and B terminal wherein signals for A terminals that contain a distinct pattern, that never occurs for the signals for the B terminals, to enable a received signal to be identifiable as being either a signal for an A wire or a signal for a B wire, regardless of whether a signal is received at an A terminal or a B terminal of the first plurality of terminals; or
    identification data is transmitted as a differential signal over a pair of wires connected to a terminal pair.

7. The device of claim 6 wherein the second plurality of terminals are arranged in pairs, each pair being for a different twisted pair of wires, wherein the signals for each terminal in a terminal pair are complementary to each other.

8. A device for assessing telecommunications wiring between a first plurality of terminals and a second plurality of terminals, the device being operable to be in electrical communication with the second plurality of terminals to transmit terminal identification data onto each of the second plurality of terminals, wherein the device is configured to generate different signals for respective terminals of the second plurality of terminals, each signal encoding different terminal identification data,
  wherein said device is configured to transmit terminal identification data according to at least one of the following:
    transmit terminal identification data onto all of the second plurality of terminals for a time determined by the device;
    transmit terminal identification data onto all of the second plurality of terminals for a fixed time;
    transmit identification data on each of the second plurality of terminals without waiting for an acknowledgement or other reply signal from the first plurality of terminals to indicate whether any transmitted identification data has been received at the first plurality of terminals; or
    transmit identification data repeatedly for, a fixed or indefinite number of times, on all of the terminals until the device is deactivated.

9. The device of claim 6 which includes a module having a connector for electrically connecting to a plurality of terminals.

10. The device of claim 9 which is expandable to include one or more further connectors for simultaneously connecting to further terminals.

11. A method for assessing telecommunications wiring between a first plurality of terminals and a second plurality of terminals, the method including:
  decoding terminal identification data received on each of the first plurality of terminals, wherein, for each terminal of the first plurality of terminals, the received identification data is specific to a single terminal of the second plurality of terminals,
  wherein the method comprises transmitting the terminal identification data onto each of the second plurality of terminals, the terminal identification data transmitted according to one or more of the following:
    identification data is transmitted in a data packet including a plurality of symbols;
    identification data is transmitted in a data packet including a total number of transmitted 1's that is equal to the total number of transmitted 0's transmitted over the course of the data packet;
    identification data is transmitted in a data packet said packet including a plurality of symbols wherein each symbol in the data packet has a complementary number of 0's and 1's to the number of 0's and 1's in any preceding or following symbol in the data packet;
    an average voltage of the transmitted signal is a midway between the highest and lowest voltage of the transmitted signal to enable a signalling reference to be derived from a net DC level of a set of transmitted signals;
    a signalling scheme to be used in the case that the plurality of second terminals includes pairs of terminals each including an A terminal and B terminal wherein signals for A terminals that contain a distinct pattern, that never occurs for the signals for the B terminals, to enable a received signal to be identifiable as being either a signal for an A wire or a signal for a B wire, regardless of whether a signal is received at an A terminal or a B terminal of the first plurality of terminals; and
    identification data is transmitted as a differential signal over a pair of wires connected to a terminal pair.

12. A device for assessing telecommunications wiring between a first plurality of terminals and a second plurality of terminals, the device being operable to be in electrical communication with the first plurality of terminals to listen for terminal identification data that is receivable on each of the first plurality of terminals, wherein the device is configured to decode, for each terminal of the first plurality of terminals, identification data that is specific to a single terminal of the second plurality of terminals and including a plurality of single-ended inputs for receiving signals from respective terminals of the first plurality of terminals,
wherein the device determines for each terminal whether, after listening for data for a set duration of time, that data has been correctly received, wherein determining correct receipt of data preferably comprises at least one of:
determining receipt of a single packet that defines terminal identification data is sufficient to consider that data has been correctly received;
verifying a Cyclic Redundancy Check of a received data packet; or
receiving identical terminal identification data a predetermined number of times within the set duration of time.

13. A device for assessing telecommunications wiring between a first plurality of terminals and a second plurality of terminals, the device being operable to be in electrical communication with the first plurality of terminals to listen for terminal identification data that is receivable on each of the first plurality of terminals, wherein the device is configured to decode, for each terminal of the first plurality of terminals, identification data that is specific to a single terminal of the second plurality of terminals and including a plurality of single-ended inputs for receiving signals from respective terminals of the first plurality of terminals,
wherein the device determines a signalling reference from signals received on the first plurality of terminals.

14. A device for assessing telecommunications wiring between a first plurality of terminals and a second plurality of terminals, the device being operable to be in electrical communication with the first plurality of terminals to listen for terminal identification data that is receivable on each of the first plurality of terminals, wherein the device is configured to decode, for each terminal of the first plurality of terminals, identification data that is specific to a single terminal of the second plurality of terminals and including a plurality of single-ended inputs for receiving signals from respective terminals of the first plurality of terminals,
wherein identification data is arranged according to one or more of the following:
identification data is transmitted in a data packet including a plurality of symbols;
identification data is transmitted in a data packet including a total number of transmitted 1's that is equal to the total number of transmitted 0's transmitted over the course of the data packet;
identification data is transmitted in a data packet said packet including a plurality of symbols wherein each symbol in the data packet has a complementary number of 0's and 1's to the number of 0's and 1's in any preceding or following symbol in the data packet;
an average voltage of the transmitted signal is a midway between the highest and lowest voltage of the transmitted signal to enable a signalling reference to be derived from a net DC level of a set of transmitted signals;
a signalling scheme to be used in the case that the plurality of second terminals includes pairs of terminals each including an A terminal and B terminal wherein signals for A terminals that contain a distinct pattern, that never occurs for the signals for the B terminals, to enable a received signal to be identifiable as being either a signal for an A wire or a signal for a B wire, regardless of whether a signal is received at an A terminal or a B terminal of the first plurality of terminals; or
identification data is transmitted as a differential signal over a pair of wires connected to a terminal pair.

15. A method for assessing telecommunications wiring between a first plurality of terminals and a second plurality of terminals, the method including:
decoding terminal identification data received on each of the first plurality of terminals, wherein, for each terminal of the first plurality of terminals, the received identification data is specific to a single terminal of the second plurality of terminals,
wherein the method further includes determining a signalling reference from signals received on the first plurality of terminals, the signalling reference derived from a net DC level of a received signal.

16. A method for assessing telecommunications wiring between a first plurality of terminals and a second plurality of terminals, the method including:
decoding terminal identification data received on each of the first plurality of terminals, wherein, for each terminal of the first plurality of terminals, the received identification data is specific to a single terminal of the second plurality of terminals,
wherein the method is performed by a device, and wherein transmission of terminal identification data onto the second plurality of terminals is performed in accordance with any one or more of the following:
transmitting terminal identification data onto all of the second plurality of terminals for a time determined by the device;
transmitting terminal identification data onto all of the second plurality of terminals for a fixed time;
transmitting identification data on each of the second plurality of terminals without waiting for an acknowledgement or other reply signal from the first plurality of terminals to indicate whether any transmitted identification data has been received at the first plurality of terminals; or
transmitting identification data repeatedly for, a fixed or indefinite number of times, on all of the terminals until the device is deactivated.

* * * * *